(12) United States Patent
Bol

(10) Patent No.: US 7,319,059 B2
(45) Date of Patent: Jan. 15, 2008

(54) HIGH DENSITY FET WITH SELF-ALIGNED SOURCE ATOP THE TRENCH

(75) Inventor: Igor Bol, Sherman Oaks, CA (US)

(73) Assignee: International Rectifier Corporation, El Segundo, CA (US)

( * ) Notice: Subject to any disclaimer, the term of this patent is extended or adjusted under 35 U.S.C. 154(b) by 360 days.

(21) Appl. No.: 11/047,243

(22) Filed: Jan. 31, 2005

(65) Prior Publication Data

US 2006/0172487 A1    Aug. 3, 2006

(51) Int. Cl.
*H01L 21/336* (2006.01)
(52) U.S. Cl. .................. 438/268; 438/270; 438/272
(58) Field of Classification Search ........ 438/268–270, 438/272, 273; 257/330, 332
See application file for complete search history.

(56) References Cited

U.S. PATENT DOCUMENTS 6,974,750 B2 * 12/2005 Haase .................. 438/270
7,166,891 B2 *  1/2007 Yoshimochi ............ 257/329

* cited by examiner

*Primary Examiner*—Hsien-Ming Lee
(74) *Attorney, Agent, or Firm*—Ostrolenk, Faber, Gerb & Soffen, LLP

(57) ABSTRACT

A method for manufacturing a power semiconductor device which includes forming a semiconductor region such as a polysilicon layer or epitaxially grown silicon over a region implanted with source implants and applying heat in a thermal step to cause the source implants to diffuse into the semiconductor region.

18 Claims, 4 Drawing Sheets

HIGH DENSITY FET WITH SELF-ALIGNED SOURCE ATOP THE TRENCH

FIELD OF THE INVENTION

The present invention relates to semiconductor devices and more particularly for a method of manufacturing a power semiconductor device.

BACKGROUND AND SUMMARY OF THE INVENTION

The ever increasing demands for more efficient power supplies and longer lasting battery-powered electronic devices have made efficiency in power management systems one of the most challenging areas for engineers. Thus, improving the characteristics of discrete power devices, such as power MOSFETs, which are used in power management systems, continue to push manufacturers to produce devices with lower ON-resistance, lower gate charge and higher current capability.

To improve the current carrying capability of a power semiconductor device, such as a trench type power MOSFET, the cell density of the device can be increased. The cell density of the device can be increased by reducing the size of each cell.

Each cell of a power semiconductor device, such as a trench type power MOSFET, includes a trench which receives a gate structure and two source regions each disposed at a respective side of the trench. The width of the trench as well as the lateral expanse of the source regions contribute to the cell pitch. In order to reduce the cell pitch either or both dimensions can be reduced.

A process according to the present invention has the potential for significantly reducing the size of the features in a power device, resulting in increased current carrying capability.

A power MOSFET produced according to an embodiment of the present invention is of a trench variety, in which the active region includes a plurality of trenches each supporting a gate structure and each formed in an epitaxial layer that is grown over a monolithic semiconductor substrate. Formed at the top of each of the trenches are source regions.

According to one aspect of the present invention trenches are formed in a semiconductor body of a first conductivity, a channel region of a second conductivity is then formed in the semiconductor body, gate structures are formed in the trenches, each gate structure including a top oxide layer, dopants of the first conductivity type are implanted into the top oxide layer of each gate structure, a conductive layer of the second conductivity is then formed over the semiconductor body and in contact with the top oxide layer of the gate structures, and, in a thermal step, the dopants of the first conductivity are diffused into the conductive layer of the second conductivity to form conductive regions of the first conductivity, which serve as source regions.

A process according to the present invention is advantageous as it may allow for the formation of source regions having a smaller lateral expanse compared to the prior art. For example, it is believed that 1.0 micron cell pitch can be achieved with 0.5 um photolithography and 0.8 um pitch with 0.35 um lithography. That translates approximately into double the cell density of the conventionally known technology. Higher cell density allows for the possibility of higher current carrying capability and lower $R_{DSON}$.

That is, a process according to the present invention allows for

Self-aligned source regions;
Improved body contact for better avalanche ruggedness;
Excellent contact of metal to source regions;
Flat silicon surface for better metal coverage;
A four mask process that includes only one critical masking step;
Elimination of the contact mask as a critical masking step (no contacts to the active cells are opened);
Elimination of an insulating layer such as TEOS;
Reduction of the depth of trenches;
Elimination of the need for thick aluminum and TiW barrier layer.

Other features and advantages of the present invention will become apparent from the following description of the invention which refers to the accompanying drawings.

DETAILED DESCRIPTION OF THE FIGURES

Figure 1:
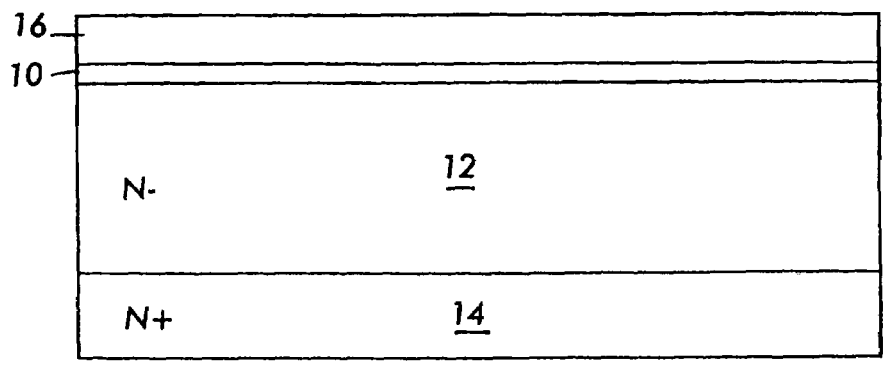
FIG. 1 illustrates a semiconductor body having a pad oxide and a hard mask grown thereon.

Referring to FIG. 1, initially a layer of pad oxide 10 is grown over one major surface of a semiconductor body 12. Semiconductor body 12 may be a layer of silicon of one conductivity (e.g. N-type) which is epitaxially grown over a first major surface of a silicon substrate 14 of the same conductivity, but usually of lower resistivity. Next, a hard mask 16 composed of, for example, $Si_3N_4$ is formed over pad oxide 10. In the preferred embodiment, pad oxide 10 may be 50 Å thick, and hard mask 16 may be 2500 Å thick.

Figure 2:
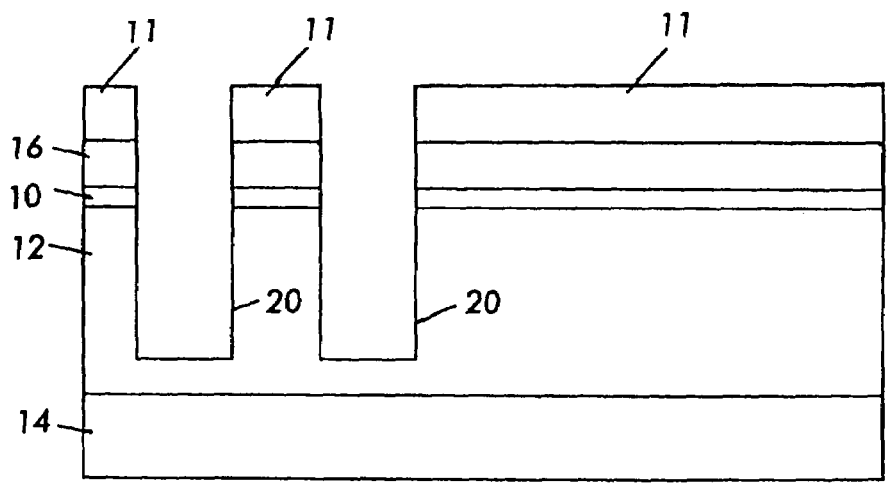
FIG. 2 illustrates the semiconductor body after having trenches formed therein.

Referring next to FIG. 2, using a known photolithographic technique, a plurality of trenches 20 are formed in semiconductor body 12 using a first trench mask 11 formed from a conventional photoresist or the like. The trenches are preferably about 1.2 microns deep. Mask 11 is then stripped away.

Figure 3:
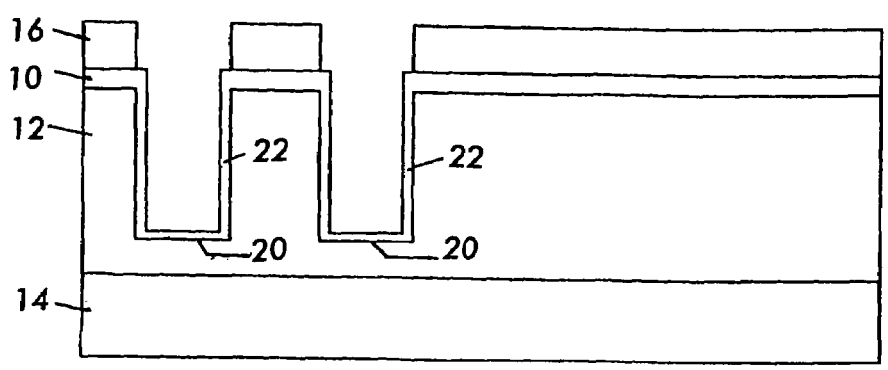
FIG. 3 illustrates the semiconductor body of FIG. 2 having oxidized the sidewalls and the bottoms of the trenches therein.

Next, the sidewalls and the bottom of each trench 20 are oxidized to form gate oxides 22 thereon as seen in FIG. 3. In the preferred embodiment, gate oxides 22 may be about 300 Å thick.

Figure 4:
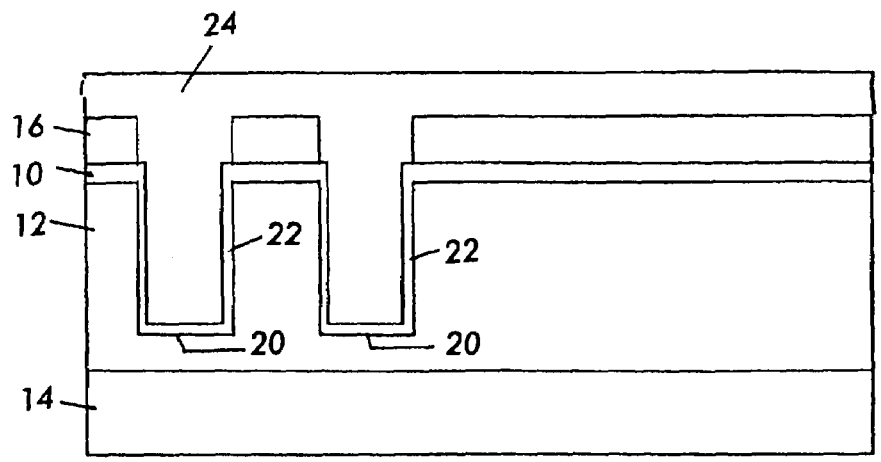
FIG. 4 illustrates the semiconductor body of FIG. 3 after polysilicon deposition.

Thereafter, as shown in FIG. 4, polysilicon 24 is deposited to fill trenches 20. Next, polysilicon 24 is masked in a second mask step, and the exposed polysilicon (polysilicon not covered by masked material) is removed by anisotropic etching or the like, leaving only gate electrodes 26 in trenches 20 and polysilicon gate bus 28 in the termination region (area adjacent the active region which contains trenches 20) as shown in FIG. 5.

Figure 5:
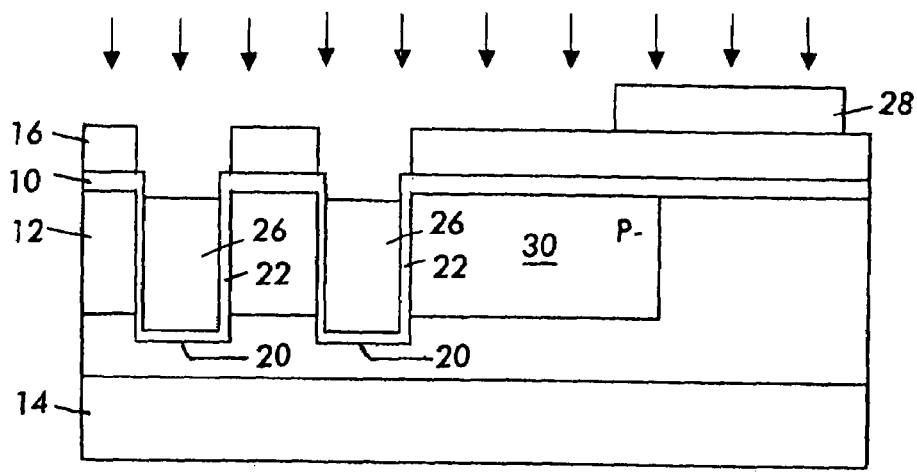
FIG. 5 illustrates the semiconductor body of FIG. 4 after removal of polysilicon to define gate electrodes inside the trenches.
Figure 6:
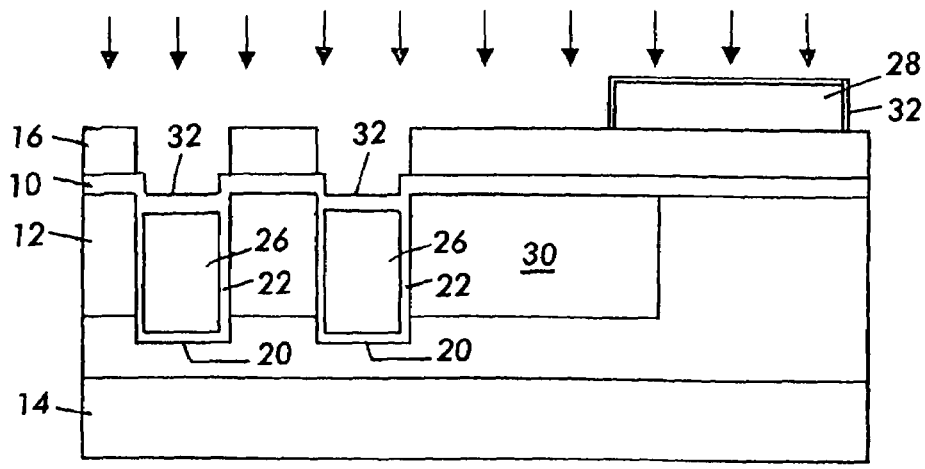
FIG. 6 illustrates the semiconductor body of FIG. 5 after a diffusion drive to drive the channel dopants.

Next, dopants of a second conductivity type (e.g. P-type) are implanted, and driven (i.e. diffused) in a thermal step to form channel region 30 (FIG. 5). During the diffusion drive the top exposed surfaces of polysilicon gate electrodes 26 and the exposed surfaces of polysilicon ring 28 are oxidized. As a result, an oxide layer 32 is formed thereon as seen in FIG. 6. In the preferred embodiment, oxide 33 is 1500 Å thick. Channel region 30, as is well known, extends to a depth that is less than the depth of trenches 20. In the preferred embodiment, boron atoms are implanted at 180 keV to result in a concentration of $1 \times 10^{13}$, and then driven by heating semiconductor body 12 to 1150° C. in a channel drive.

Next, a source implant is carried out, implanting oxide 32 atop the polysilicon gates and oxide 32 over polysilicon bus 28 with arsenic (for example 5E15 cm$^{-2}$ at 180 KeV) and phosphorus (5E15 cm$^{-2}$ at 15 KeV) to preferably saturate polysilicon oxide 32 atop gate electrodes 26 with dopants.

Figure 7:
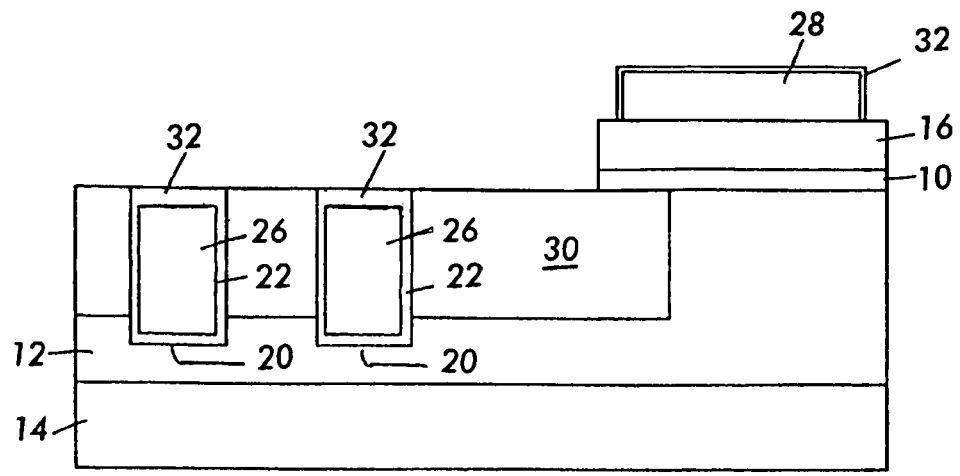
FIG. 7 illustrates the semiconductor body after removal of the hard mask and the pad oxide.

Thereafter, hard mask 16 is removed and pad oxide 10 overlying the active region are removed, each preferably in a respective wet etch step, exposing silicon 12 in the source area, the result of which is shown in FIG. 7.

Figure 8:
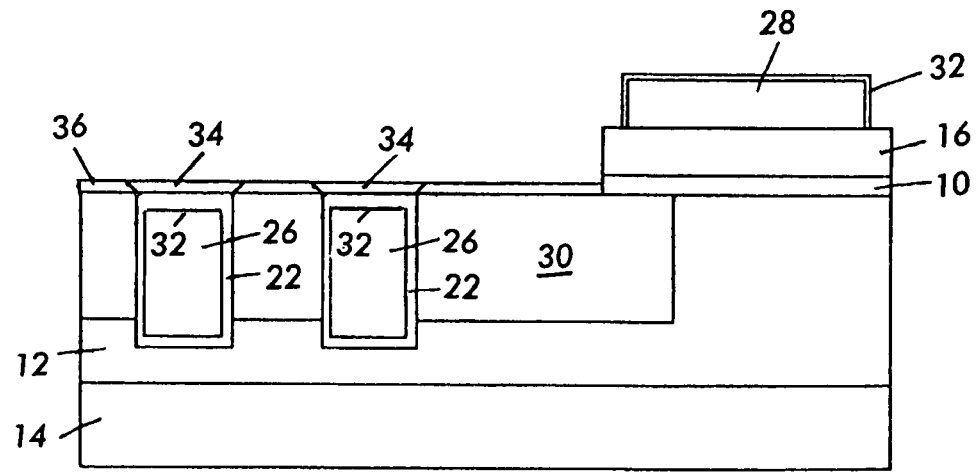
FIG. 8 illustrates the semiconductor body of FIG. 7 after having a semiconductor layer formed thereon.

Referring next to FIG. 8, according to the present invention, a semiconductor layer 36 is formed over the active region. The semiconductor layer 36 is preferably monolithic silicon that is epitaxially formed. Alternatively, semiconductor layer 36 may be formed with polysilicon. Semiconductor layer 36 is next implanted with dopants of the second conductivity type (e.g. P-type) in an implantation step, whereby it is rendered conductive. In the preferred embodiment, semiconductor layer 36 is 1000 Å thick, and implanted with $BF_2$ (for example, $1 \times 10^{14}/cm^2$ at 50 KeV). According to an aspect of the present invention, a rapid thermal anneal/drive is next applied to diffuse out arsenic and phosphorus atoms from oxide 32 into semiconductor layer 36 to form source regions 34.

Figure 9:
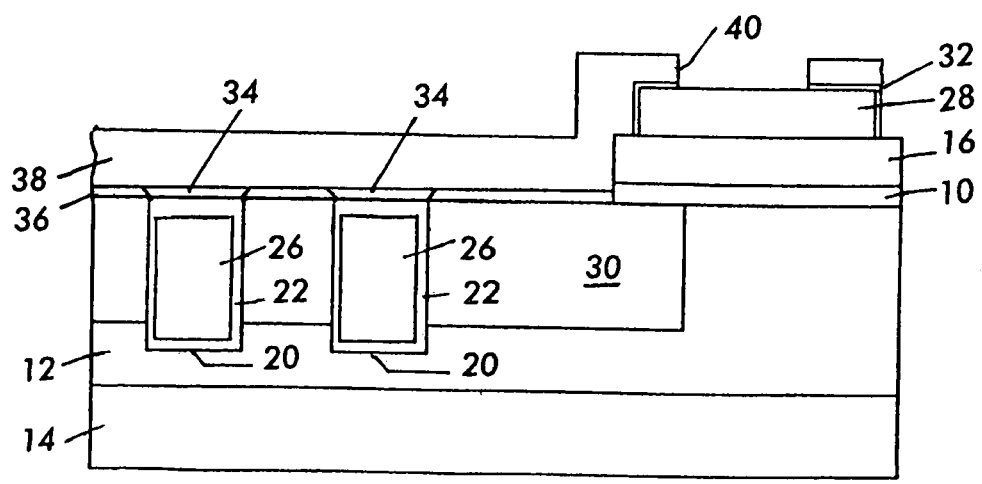
FIG. 9 illustrates the semiconductor body of FIG. 8 having a photoresist mask formed thereon.

Next, a photoresist layer 38 is formed over the entire structure of FIG. 8 as in FIG. 9. An opening 40 is formed in photoresist 38 using any known photolithographic technique (contact mask #3), and oxide 32 over polysilicon bus 28 at the bottom of opening 40 is removed using any known etching method, exposing polysilicon bus 28.

Photoresist 38 is then removed by stripping or the like. Thereafter, any known source metal is applied and patterned (metal mask #4) to form source contact 42 over the active region, and a gate contact 44.

In the preferred embodiment, a 4 µm thick aluminum is sputtered on to form source contact 42.

Figure 10:
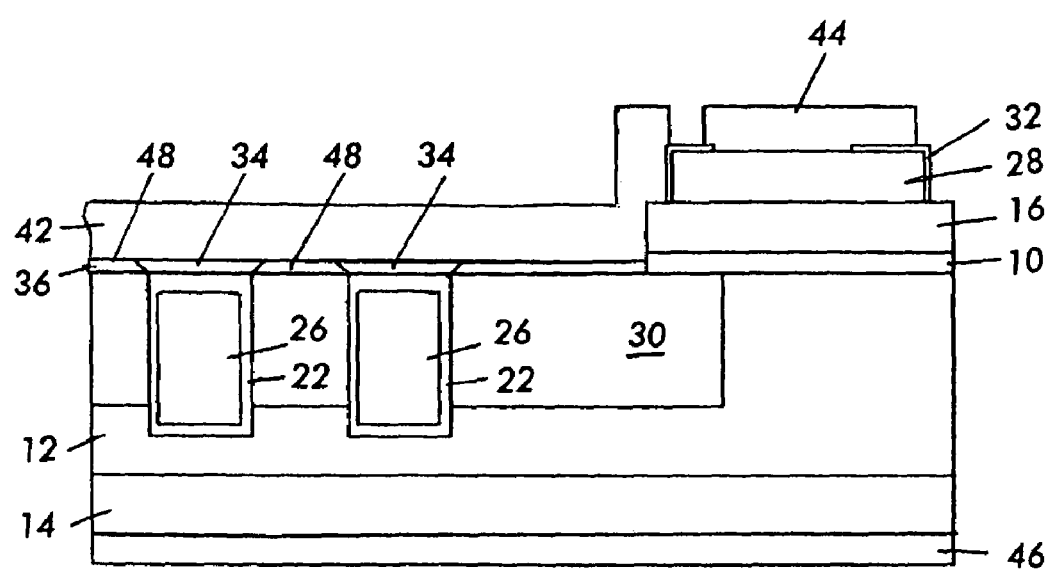
FIG. 10 illustrates the semiconductor body after application of the source metal.

It should be noted that according to one aspect of the present invention semiconductor layer 36 is doped to a high enough concentration such that portions that do not receive dopants of the first conductivity type form high conductivity contact regions 48. The purpose of high conductivity contact regions 48, as is well known, is to reduce contact resistance between source contact 42 and channel region 30. Also, a back metal is formed on substrate 14 by sputtering or the like to form drain contact 46, thereby obtaining a device such as the one shown in FIG. 10.

A process according to the present invention is advantageous because semiconductor layer 36 allows for the formation of source regions 34 adjacent gate trenches 20 thus saving valuable die area and significantly increasing the cell density. For example, it is believed that 1.0 micron cell pitch can be achieved with 0.5 um photolithography, and 0.8 um pitch with 0.35 um lithography. That translates approximately into double the cell density of the current technology. Higher cell density translates into a higher current carrying capability and lower $R_{DSON}$, which are important characteristics.

In addition, a process according to the present invention allows for

Self-aligned source regions 34;

Medium boron doped semiconductor layer 36 to improve the body contact for better avalanche ruggedness;

Excellent contact of metal to source regions 34;

Flat silicon surface for better metal coverage;

A four mask process that includes only one critical masking step, masking to form trenches 20;

Non-criticality of the contact mask (no contacts to the active cells are opened);

No insulating layer such as TEOS;

Reduction of the depth of trenches 20 because source regions 34 are above trenches 20;

Metal step coverage that eliminates the need for thick aluminum and TiW barrier layer.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for manufacturing a power semiconductor device comprising:
   forming trenches in a semiconductor body of a first conductivity;
   forming a channel region of a second conductivity in said semiconductor body;
   forming gate structures in said trenches, each gate structure including an insulation layer on top thereof;
   implanting dopants of said first conductivity in said insulation layer on top of said gate structures;
   forming a semiconductor layer over said trenches in connection with said insulation layer on top of said gate structures;
   applying a thermal step to diffuse said dopants of said first conductivity into said semiconductor layer to form conductive regions of said first conductivity; and
   forming a metal contact layer over said conductive regions.

2. A process according to claim 1, wherein said semiconductor layer is comprised of polysilicon.

3. A process according to claim 1, wherein said semiconductor layer is epitaxially grown silicon.

4. A process according to claim 1, wherein said gate structures comprise polysilicon.

5. A process according to claim 1, wherein said semiconductor layer extends over said trenches and said semiconductor body.

6. A process according to claim 1, wherein said semiconductor layer is of said second conductivity.

7. A process according to claim 6, wherein said semiconductor body is epitaxially grown silicon, which is grown over a semiconductor substrate of the same conductivity.

8. A process according to claim 7, further comprising forming another metal contact on said substrate.

9. A process according to claim 8, wherein said another metal contact is a drain contact, said metal contact layer is a source contact and said conductive regions of said first conductivity are source regions.

10. A process for manufacturing a power semiconductor device comprising:
forming trenches in a silicon body of a first conductivity;
forming a channel region of a second conductivity in said silicon body;
forming gate structures in said trenches, each gate structure including an insulation body atop thereof;
implanting dopants of said first conductivity in each said insulation body;
forming a semiconductor layer over said trenches in contact with said insulation body;
applying a thermal step to diffuse said dopants of said first conductivity into said semiconductor layer to form source regions of said first conductivity; and
forming a source contact over said source regions.

11. A process according to claim 10, wherein said semiconductor layer is comprised of polysilicon.

12. A process according to claim 10, wherein said semiconductor layer is epitaxially grown silicon.

13. A process according to claim 10, wherein said gate structures comprise polysilicon.

14. A process according to claim 13, wherein said semiconductor layer extends over said trenches.

15. A process according to claim 10, wherein said silicon body is grown over a silicon substrate of the same conductivity.

16. A process according to claim 15, further comprising forming a drain contact on said substrate.

17. A process according to claim 15, wherein said semiconductor layer is of said second conductivity.

18. A process according to claim 15, further comprising implanting said semiconductor layer with dopants of said second conductivity.

* * * * *